(12) United States Patent
Tu et al.

(10) Patent No.: US 12,261,071 B2
(45) Date of Patent: Mar. 25, 2025

(54) ELECTRONIC COMPONENT TRANSFER APPARATUS, ELECTRONIC COMPONENT TRANSFER METHOD, AND METHOD OF MANUFACTURING A LIGHT-EMITTING DIODE PANEL

(71) Applicant: ASTI GLOBAL INC., TAIWAN, Taichung (TW)

(72) Inventors: Ming-Feng Tu, Taichung (TW); Chun-Yi Lin, Taichung (TW); Sheng Che Huang, Taichung (TW); Chingju Lin, Taichung (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 543 days.

(21) Appl. No.: 17/699,168

(22) Filed: Mar. 20, 2022

(65) Prior Publication Data
US 2022/0359254 A1 Nov. 10, 2022

Related U.S. Application Data

(60) Provisional application No. 63/185,328, filed on May 6, 2021, provisional application No. 63/185,318, filed on May 6, 2021.

(30) Foreign Application Priority Data

Oct. 8, 2021 (TW) .................................. 110137634

(51) Int. Cl.
H01L 21/68 (2006.01)
H01L 25/075 (2006.01)
H10H 20/01 (2025.01)

(52) U.S. Cl.
CPC ........ *H01L 21/681* (2013.01); *H01L 25/0753* (2013.01); *H10H 20/01* (2025.01); *H10H 20/0364* (2025.01)

(58) Field of Classification Search
None
See application file for complete search history.

(56) References Cited

U.S. PATENT DOCUMENTS 8,029,499 B2 10/2011 Zimare et al.
2018/0141163 A1* 5/2018 Wendt ................ B23K 26/0846
(Continued)

OTHER PUBLICATIONS

"Office Action of Taiwan Counterpart Application", issued on Jan. 13, 2023, p. 1-p. 14.

*Primary Examiner* — Hsien Ming Lee
(74) *Attorney, Agent, or Firm* — JCIPRNET

(57) ABSTRACT

An electronic component transfer apparatus is configured to transfer an electronic component on a flexible carrier to a target substrate. The electronic component transfer apparatus includes a first frame, a second frame, an abutting component, an actuating mechanism, an energy generating device, an image capture device, and a data processing module. The first frame is configured to carry the flexible carrier. The second frame is configured to carry the target substrate. The abutting component is disposed adjacent to the flexible carrier. The actuating mechanism is configured to actuate the abutting component, so that the abutting end of the abutting component abuts against the flexible carrier. The energy generating device generates an energy beam. The image capture device captures an image through the abutting component. The data processing module receives and computes the image to determine whether to adjust the relative position between the abutting end and the flexible carrier.

11 Claims, 9 Drawing Sheets

(56) References Cited

U.S. PATENT DOCUMENTS

2018/0366433 A1* 12/2018 Ahn .................. H01L 25/50
2023/0144191 A1*  5/2023 Chaji ................ H01L 23/544
                                                257/797

* cited by examiner

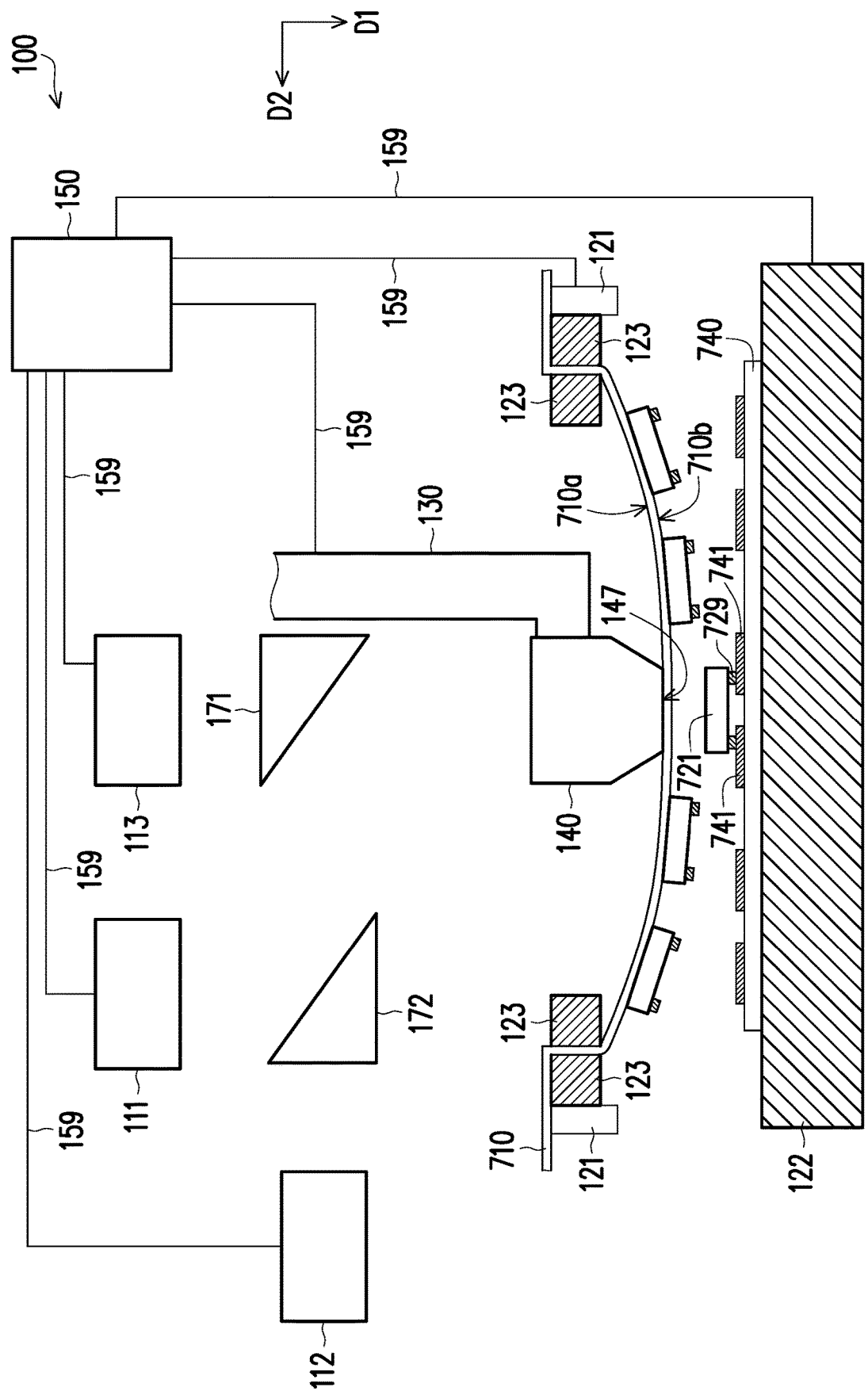

ELECTRONIC COMPONENT TRANSFER APPARATUS, ELECTRONIC COMPONENT TRANSFER METHOD, AND METHOD OF MANUFACTURING A LIGHT-EMITTING DIODE PANEL

CROSS-REFERENCE TO RELATED APPLICATION

This application claims the priority benefits of U.S. provisional application Ser. No. 63/185,318, filed on May 6, 2021, U.S. provisional application Ser. No. 63/185,328, filed on May 6, 2021, and Taiwan application serial no. 110137634, filed on Oct. 8, 2021. The entirety of each of the above-mentioned patent applications is hereby incorporated by reference herein and made a part of this specification.

BACKGROUND

Technical Field

The disclosure relates to an apparatus for transferring electronic component, a method for transferring electronic component, and a manufacturing method of a light-emitting diode panel.

Description of Related Art

In the manufacturing process of electronic products, there are often related electronic component transfer steps. For example, in the manufacturing process of a light-emitting diode display (LED display) panel, light-emitting diodes are often placed on a thin film transistor array (TFT array) substrate by a pick-and-place apparatus, and then the light-emitting diodes located on the TFT array substrate are fixed and electrically connected to the TFT array substrate. However, in the above-mentioned manner, if there are slight vibrations in the environment or equipment after the light-emitting diodes are placed on the TFT array substrate and before the light-emitting diodes are fixed on the TFT array substrate, chances are that the unfixed light-emitting diodes will shift as a result. Moreover, the throughput of the above-mentioned manner may be low.

SUMMARY

The disclosure provides an apparatus for transferring electronic component and a method for transferring electronic component, both configured to transfer an electronic component.

The apparatus for transferring electronic component of the disclosure is configured to transfer an electronic component on a flexible carrier to a target substrate. The apparatus for transferring electronic component includes a first frame, a second frame, an abutting component, an actuating mechanism, an energy generating device, an image capture device, and a data processing module. The first frame is configured to carry the flexible carrier. The second frame is configured to carry the target substrate, and the target substrate and the flexible carrier are disposed opposite to each other. The abutting component is disposed adjacent to the flexible carrier and has an abutting end. The actuating mechanism is configured to actuate the abutting component, and the abutting component is moved towards the direction of the flexible carrier, so that the abutting end of the abutting component abuts against the flexible carrier. The energy generating device may generate an energy beam, and the energy beam is directed towards the flexible carrier through the abutting end of the abutting component. The image capture device captures an image through the abutting end of the abutting component. The data processing module may receive and compute the image captured by the image capture device, and determine whether to adjust the relative position between the abutting end and the flexible carrier according to a computation result.

The method for transferring electronic component of the disclosure includes the following steps. A flexible carrier is provided, and an electronic component is carried on a surface thereof. A target substrate is provided, and a bonding pad is disposed on a surface thereof. The surface of the flexible carrier carrying the electronic component is disposed opposite to the surface of the target substrate disposed with the bonding pad, and at least one of the electronic component and the bonding pad is disposed with solder. An abutting component is provided, and the abutting component allows light to pass through, has an abutting end, and is located at an original position. The abutting component is moved away from the original position and moved towards a surface of the flexible carrier without the electronic component, and the surface is abutted against by the abutting end, so that the flexible carrier is deformed, and the electronic component is moved towards the target substrate. An image of the position of the electronic component is captured through the abutting end of the abutting component. An offset vector of the position of the electronic component is computed. According to the offset vector, the relative position between the abutting end of the abutting component and the flexible carrier is changed as necessary to correct the offset vector. An energy beam is provided, and the energy beam is directed to pass through the abutting component to melt the solder between the electronic component and the bonding pad, and the electronic component is soldered and fixed on the target substrate by the solder. The abutting component is returned to the original position.

The manufacturing method of the light-emitting diode panel of the disclosure includes the following steps. The aforementioned electronic component transfer method is used to transfer a light-emitting diode die to a target substrate.

Based on the above, the apparatus for transferring electronic component and the method for transferring electronic component of the disclosure may be adapted for transferring the electronic component on the flexible carrier to the target substrate.

BRIEF DESCRIPTION OF THE DRAWINGS

FIGS. 1A to 1F are partial side schematic views of a part of an operation mode of an apparatus for transferring electronic component according to an embodiment of the disclosure.

DESCRIPTION OF THE EMBODIMENTS

Figure 1A:
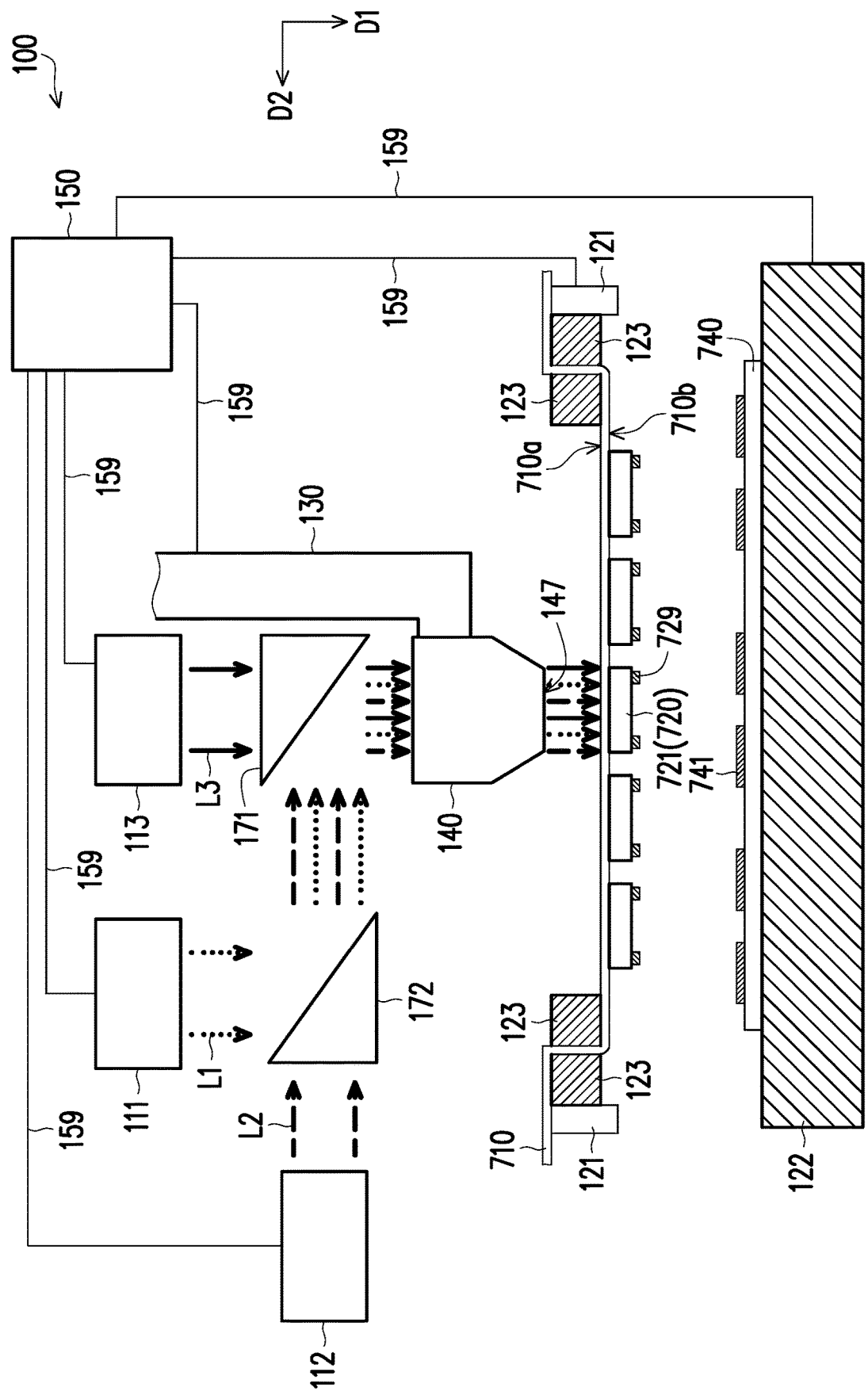

The content of the following embodiments is for illustration and not for limitation. Moreover, descriptions of known devices, methods, and materials may be omitted so as not to obscure the descriptions of various principles of the disclosure. Directional terms (e.g., up, down, top, and bottom) as used herein refer only to the graphical usage or corresponding idioms in the drawings, and are not intended to imply absolute orientation. In addition, unless the content clearly dictates otherwise, the singular forms "a," "an," "the," or forms that do not specifically refer to a quantity may include one or plural forms, i.e., include "at least one."

In some of the drawings, some elements or film layers may be enlarged, reduced, or omitted for clarity. Similar components are denoted by the same reference numerals, and have similar functions, materials, or forming manners, and descriptions are omitted. It will be apparent to those of ordinary skill in the art to which the disclosure pertains, from the content of the embodiments and the corresponding illustrations, that the disclosure may be practiced in other embodiments that depart from the specific details disclosed herein.

Referring to FIG. 1A, an apparatus 100 for transferring electronic component (may be referred as: electronic component transfer apparatus 100) adapted for transferring an electronic component 720 is provided. In the embodiment, the electronic component 720 may be transferred from a flexible carrier 710 by the electronic component transfer apparatus 100 and soldered to a target substrate 740 (described in detail later). That is, the electronic component transfer apparatus 100 may be referred to as a transfer soldering apparatus. The electronic component transfer apparatus 100 includes a first frame 121, a second frame 122, an abutting component 140, an actuating mechanism 130, an energy generating device 113, at least one image capture device (e.g., at least one of an image capture device 111 and the image capture device 112), and a data processing module 150. The first frame 121 is adapted for carrying the flexible carrier 710. The second frame 122 is adapted for carrying the target substrate 740. Moreover, after the target substrate 740 is carried on the second frame 122, the target substrate 740 on the second frame 122 may be disposed opposite to the flexible carrier 710. The actuating mechanism 130 is adapted for actuating the abutting component 140 directly or indirectly. The abutting component 140 may be disposed adjacent to the flexible carrier 710. Moreover, the abutting component 140 may be actuated directly or indirectly by the actuating mechanism 130 to relatively move towards the direction of the flexible carrier 710. In addition, an abutting end 147 of the abutting component 140 may abut against the flexible carrier 710, so as to abut the electronic component 720 on the flexible carrier 710 to the target substrate 740. The energy generating device 113 may generate an energy beam L3. The energy beam L3 may be directed towards the flexible carrier 710 through the abutting end 147 of the abutting component 140. The image capture device may capture an appropriate image through the abutting end 147 of the abutting component 140. The data processing module 150 may receive and compute the corresponding image captured by the image capture device.

In the embodiment, the material of the first frame 121 may include metal, glass, or plastic, but the disclosure is not limited thereto. In an embodiment, the first frame 121 may include a corresponding fixing member (such as, but not limited to, a clamp and/or a clip), and may be adapted for fixing the flexible carrier 710 directly and/or indirectly. For example, the first frame 121 may indirectly fix the flexible carrier 710 through a carrier frame 123. For another example, where the first frame 121 and the flexible carrier 710 are in contact, the flexible carrier 710 may be directly fixed by frictional force or other suitable manners.

In an embodiment, the first frame 121 may include a corresponding transmission member (such as, but not limited to, a roller), and the flexible carrier 710 may be conveyed in an appropriate direction. It is worth noting that the aforementioned fixing member and the aforementioned transmission member may be the same component or different components. For example, the flexible carrier 710 may be sandwiched between two rollers, and when the rollers are not rotated, the flexible carrier 710 may be fixed correspondingly; and in the state where the rollers are rotated, the flexible carrier 710 may be conveyed correspondingly.

In an embodiment, the first frame 121 may be fixed or mounted on a movable unit. In this way, the first frame 121 may move and/or rotate in a corresponding direction according to design requirements. The movable unit may include a movable module commonly used in the design of a movable mechanism (e.g., a horizontal movement module, a vertical movement module, a rotary movement module, or a combination of the above), and corresponding hardware or software may be included therein, or an auxiliary member may be further combined. For example, the movable module may have a power supply device, a motor, a belt, a gear, and other related elements, which is not limited in the disclosure. The aforementioned related elements include, for example, communication elements, power elements, etc., which is not limited in the disclosure. The aforementioned software includes, for example, spatial computing software, error recording software, communication software, etc., which is not limited in the disclosure. The aforementioned auxiliary member includes, for example, a moving rail, a moving shaft, a damping element, a positioning device, etc., which is not limited in the disclosure.

In the embodiment, the flexible carrier 710 may include an ultraviolet tape (UV tape) or a blue tape, but the disclosure is not limited thereto. In an embodiment, the carrier frame 123 may be referred to as a blue tape frame, but the disclosure is not limited thereto.

In an embodiment, the flexible carrier 710 may be a composite material. For example, the flexible carrier 710 may have a polymer film or ultra-thin glass covered with an adhesive layer.

In the embodiment, the target substrate 740 may include a corresponding circuit, and the circuit may include a corresponding pad 741 exposed to the outside. In an embodiment, the target substrate 740 may include a rigid circuit board or a flexible circuit board, but the disclosure is not limited thereto. In an embodiment, the target substrate 740 may be a circuit board (such as, but not limited to, a thin film transistor array substrate) further including an active element.

In an embodiment, the pad 741 may be adapted to have solder disposed thereon (but not limited to). Therefore, the pad 741 may also be referred to as a bonding pad.

In the embodiment, the electronic component 720 may include a die and a conductive connecting member 729 disposed on the die, but the disclosure is not limited thereto. The die may include a light-emitting die (such as, but not limited to, a light-emitting diode die) or an integrated circuit (IC), but the disclosure is not limited thereto. At least one light beam (e.g., one of the energy beams L3) projected by the energy generating device 113 may be adapted for melting at least a portion of the conductive connecting member 729. In an embodiment, the conductive connecting member 729 includes, for example, solder, but the disclosure is not limited thereto.

In an unillustrated embodiment, the electronic component 720 may include a die similar to the aforementioned die, and the target substrate 740 may have a corresponding conductive connecting member similar to the aforementioned conductive connecting member 729.

In the embodiment, the image capture device may project an appropriate light beam (e.g., a photo flash). In addition, a corresponding capture image may be obtained by the reflection of light (e.g., the reflective light of the aforementioned sensing beam reflected by the object to be sensed). In a possible embodiment, if the intensity of the ambient light is strong enough, the projection of the aforementioned light beam may also be omitted (but not limited to, that is, still be applied).

In the embodiment, the image capture device may include a first image capture device 111 and a second image capture device 112. The first image capture device 111 may project a first light beam L1, and/or the second image capture device 112 may project a second light beam L2. The first image capture device 111 and the second image capture device 112 may capture corresponding images at different positions, respectively. For example, the focus of the first image capture device 111 is different from the focus of the second image capture device 112.

In a possible embodiment, if the depth of field (DOF) of the image capture device is large enough (for example, the aforementioned DOF is greater than or equal to the relative displacement distance of the flexible carrier 710 in the abutting direction D1), there may be only one image capture device (e.g., one of the first image capture device 111 and the second image capture device 112).

In the embodiment, the energy generating device 113 is adapted for projecting the energy beam L3. At least a portion of the light path of the energy beam L3 is different from at least a portion of the light paths of the first light beam L1 and the second light beam L2. For example, the energy beam L3 may pass through an optical element 171 and be directed to the abutting component 140, and the first light beam L1 and the second light beam L2 may be reflected by the optical element 171 and directed to the abutting component 140. For another example, the light path of the energy beam L3 may not substantially pass through an optical element 172, the second light beam L2 may pass through the optical element 172 and be directed to the abutting component 140, and the first light beam L1 may be reflected by the optical element 172 and directed to the abutting component 140.

In an embodiment, the optical element 171 or the optical element 172 may include a prism, but the disclosure is not limited thereto. In an unillustrated embodiment, the optical element 171 or the optical element 172 may include a transflective mirror.

It is worth noting that, for the sake of clarity, in FIG. 1A or other similar figures, the corresponding arrows are schematically used to represent a portion of the optical path of the energy beam L3, a portion of the optical path of the second light beam L2 and/or a portion of the optical path of the first light beam L1. The above representation does not limit the energy, wavelengths, optical paths, overall light paths of the energy beam L3, the second light beam L2, and the first light beam L1, and/or whether the energy beam L3, the second light beam L2, and the first light beam L1 are projected simultaneously or non-simultaneously. For example, other suitable optical elements (such as, but not limited to, light reflective elements, lenses, filters, apertures, etc.) may be disposed on the corresponding optical paths of each light beam.

In the embodiment, the material of the abutting component 140 may be adapted for allowing the energy beam L3, the second light beam L2, and/or the first light beam L1 to pass through (may be referred to as transparent). The transmittance of the energy beam L3, the second beam L2, and/or the first beam L1 to the material of the abutting component 140 is, for example, greater than or equal to 50%; greater than or equal to 60%; greater than or equal to 70%; greater than or equal to 75%; greater than or equal to 80%; greater than or equal to 85%; greater than or equal to 90%; greater than or equal to 95%; or greater than or equal to 98%. In an embodiment, the material of the abutting component 140 may be quartz, but the disclosure is not limited thereto. In an embodiment, the material of the abutting component 140 may include sapphire (e.g., synthetic sapphire) or diamond (e.g., synthetic diamond). It should be noted that the disclosure does not limit whether the transmittance of the energy beam L3 to the material of the abutting component 140, the transmittance of the second beam L2 to the material of the abutting component 140, and the transmittance of the first light beam L1 to the abutting component 140 need to be the same or different.

In an embodiment, the abutting component 140 may be a homogeneous material, and with the homogeneous material, elements may no longer be separated into different single materials by mechanical methods (e.g., crushing, shearing, cutting, sawing, grinding, etc.). In other words, the abutting component 140 may not have an interface formed by different materials, different processes (e.g., adhesion), and/or different objects (e.g., embedded objects).

In an embodiment, there may be a transparent channel extending to the abutting end 147. Moreover, the aforementioned channel may be adapted for allowing the energy beam L3, the second light beam L2, and/or the first light beam L1 to pass through.

Further, in the embodiment, the energy beam L3, the second light beam L2, and/or the first light beam L1 may at least partially pass through the flexible carrier 710. For example, the flexible carrier 710 may have a first surface 710a and a second surface 710b. The second surface 710b is opposite to the first surface 710a. The electronic component 720 is located on the second surface 710b. The energy beam L3, the second light beam L2, and/or the first light beam L1 may at least partially pass through the flexible carrier 710 in a direction from the first surface 710a to the second surface 710b.

In an embodiment, the energy beam L3 may be a laser beam. In an embodiment, the energy beam L3 may be an infrared beam (such as, but not limited to, a beam with a wavelength of about 1064 nanometers (nm)). For example, the energy beam L3 may be an infrared laser beam.

In the embodiment, the actuating mechanism 130 may include a movable module commonly used in the design of a movable mechanism (such as a horizontal movement module, a vertical movement module, a rotary movement module, or a combination of the above), and corresponding hardware or software may be included therein, or an auxiliary member may be further combined. For example, the movable module may have a power supply device, a motor, a belt, a gear, and other related elements, which is not limited in the disclosure. The aforementioned related elements include, for example, communication elements, power elements, etc., which is not limited in the disclosure. The aforementioned software includes, for example, spatial computing software, error recording software, communication software, etc., which is not limited in the disclosure. The aforementioned auxiliary member includes, for example, a moving rail, a moving shaft, a damping element, a positioning device, etc., which is not limited in the disclosure. In this way, the abutting component 140 directly or indirectly fixed to the actuating mechanism 130 may be moved and/or rotated in a corresponding direction according to design requirements.

In an embodiment, the abutting component 140 may be indirectly fixed to the actuating mechanism 130, but the disclosure is not limited thereto. For example, the actuating mechanism 130 may indirectly fix the abutting component 140 through a common fixing member (not shown; such as, but not limited to, a screw, a clasp, glue, and/or corresponding threads between two components) and/or an elastic member (not shown; such as, but not limited to, an O-ring and/or a spring).

In the embodiment, the data processing module 150 may be signal-connected to corresponding components, elements, or units (such as, but not limited to, the first frame 121, the second frame 122, the actuating mechanism 130, the energy generating device 113, the first image capture device 111, and/or the second image capture device 112) in the form of wired signal transmission through a corresponding signal circuit 159, but the disclosure is not limited thereto. In an embodiment, the data processing module 150 may be signal-connected to corresponding components, elements, or units in the form of wireless signal transmission. That is, the electronic component transfer apparatus 100 including the data processing module 150 and the first frame 121, the second frame 122, the actuating mechanism 130, the energy generating device 113, the first image capture device 111, and/or the second image capture device 112 signal-connected thereto is one single piece of equipment or machinery. In addition, the signal connection mentioned in the disclosure may generally refer to the connection mode of wired signal transmission or wireless signal transmission. In addition, the disclosure does not limit whether all signal connection modes need to be the same or different.

In the embodiment, the data processing module 150 may include corresponding hardware or software.

In an embodiment, the data processing module 150 includes, for example, an input unit, an output unit, an arithmetic unit, and/or a storage unit. The input unit includes, for example, a keyboard, a mouse, a touch screen, a signal receiving terminal (e.g., a corresponding data port or an antenna), and/or other similar units adapted for data input. The output unit includes, for example, a screen, a printer, a signal output terminal (e.g., a corresponding data port or an antenna), and/or other similar units adapted for data output. The arithmetic unit includes, for example, a central processing unit (CPU), a graphics processing unit (GPU), a physics processing unit (PPU), or other similar units adapted for performing computations, logical judgments, and/or data processing. The storage unit includes, for example, a memory, a hard disk, a disk array, a database, and/or other similar units adapted for permanent or temporary data storage.

In the embodiment, after receiving the corresponding image signal captured by the image capture device (e.g., at least one of the image capture device 111 and the image capture device 112), the data processing module 150 may perform computations on the captured corresponding image. The aforementioned computations include, but are not limited to, edge/boundary computing, alignment point computing, or displacement/shift computing for objects. In addition, the data processing module 150 may determine whether to adjust the relative position between the abutting end 147 and the flexible carrier 710 by using the corresponding component according to the result of the aforementioned computation.

In the embodiment, the second frame 122 may not transmit light. The material of the second frame 122 may include metal, plastic, or other materials adapted for supporting or fixing the target substrate 740.

In an embodiment, the second frame 122 may be fixed or mounted on a movable unit (not directly shown). In this way, the second frame 122 may move and/or rotate in a corresponding direction according to design requirements.

The method in which the electronic component 720 is transferred from the flexible carrier 710 to the target substrate 740 by the electronic component transfer apparatus 100 may be as described below. However, it should be noted that the disclosure is not limited to the methods described later.

Referring to FIG. 1A, the electronic component transfer apparatus 100 is provided. And then, the following steps are performed in no particular order. The target substrate 740 having the pad 741 is disposed on the second frame 122 of the electronic component transfer apparatus 100, and the flexible carrier 710 having at least one electronic component 720 disposed thereon is disposed on the first frame 121. Moreover, the electronic component 720 disposed on the flexible carrier 710 is disposed to face the target substrate 740 with a corresponding distance therebetween. It should be noted that in FIG. 1A, the number and/or the configuration of the electronic components 720 disposed on the flexible carrier 710 is only illustrative, and is not limited in the disclosure. It should be also noted that in FIG. 1A, the method of disposing the target substrate 740 on the second frame 122 of the electronic component transfer apparatus 100 and/or the method of disposing the flexible carrier 710 on the first frame 121 are only illustrative, and are not limited in the disclosure.

In an embodiment, after the flexible carrier 710 having at least one electronic component 720 disposed thereon and the target substrate 740 are disposed at corresponding positions, the energy beam L3 may be selectively projected on the electronic component 721 (e.g., one of the electronic components 720) by the energy generating device 113; and/or a first image of the electronic component 721 located on the flexible carrier 710 may be selectively captured by the first image capture device 111. The first image may be the same as or similar to the image shown in FIG. 2, but the disclosure is not limited thereto.

In an embodiment, the energy beam L3 may include a preheating beam, but the disclosure is not limited thereto.

Figure 1B:
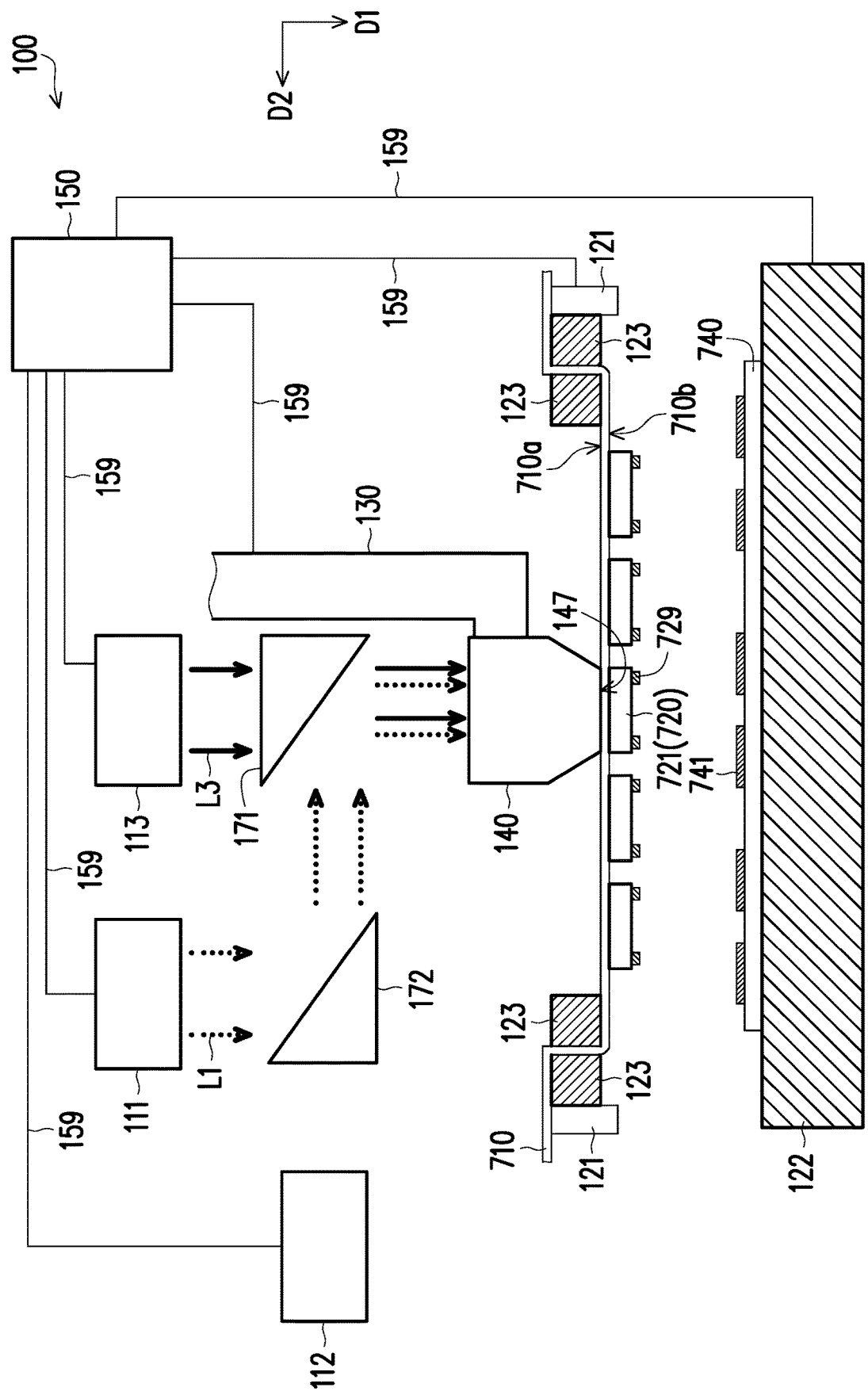

Referring to FIGS. 1A to 1B, the abutting component 140 of the electronic component transfer apparatus 100 and the flexible carrier 710 are brought close to each other in the abutting direction D1, so as to further make the abutting end 147 of the abutting component 140 abut against a surface of the flexible carrier 710 that does not carry the electronic component 720 (e.g., the first surface 710*a*).

In an embodiment, when the abutting component 140 abuts against the flexible carrier 710, a second image of the electronic component 721 located on the flexible carrier 710 may be selectively captured by the first image capture device 111.

In an embodiment, whether the displacement correction is required may be determined by comparing the aforementioned second image with the aforementioned first image.

Figure 2:
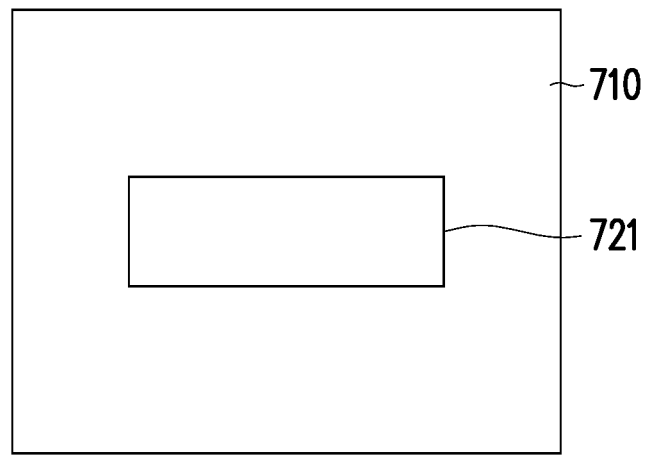
FIGS. 2 to 5 are schematic diagrams of corresponding images captured by an apparatus for transferring electronic component according to an embodiment of the disclosure.

For example, if the second image may be the same as or similar to the image shown in FIG. 2, it may be considered that the corresponding electronic component 721 is not displaced or the displacement is within an acceptable range. Therefore, the step of displacement correction may be omitted. The step of displacement correction is as described later.

Figure 3:
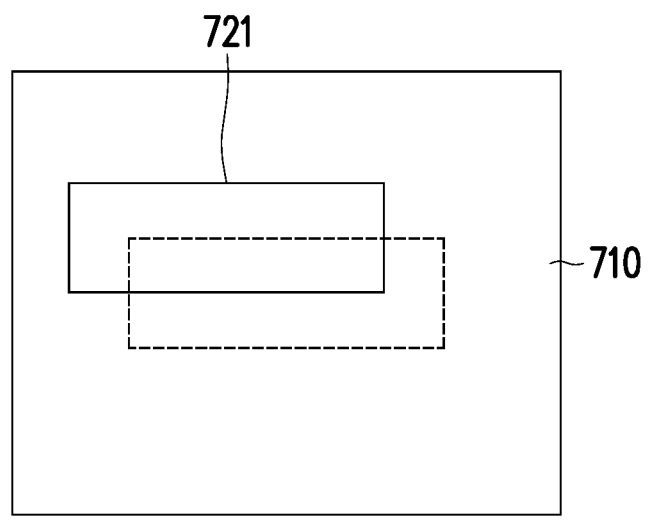

For another example, if the second image may be the same as or similar to the image shown in FIG. 3, it may be considered that the displacement of the corresponding electronic component 721 exceeds the standard. Therefore, the step of displacement correction may be performed. Specifically, taking FIG. 3 as an example, the original expected position of the electronic component 721 in the second image may be shown as a dotted line (i.e., the position corresponding to FIG. 2). However, if the actual position of the electronic component 721 in the second image has been shifted (i.e., as shown in FIG. 3), the data processing module 150 may compute the offset vector of the electronic component 721 (i.e., including the direction of the offset and the corresponding distance), and displacement correction may be performed. The displacement correction manner includes, but is not limited to, relative movement of the first frame 121 or the abutting component 140 in an appropriate direction (e.g., a direction D2 perpendicular to the abutting direction D1, so as to change the relative position between the abutting end 147 of the abutting component 140 and the flexible carrier 710. For example, when performing the aforementioned displacement correction, in any direction parallel to the direction D2, at least one of the abutting component 140 and the first frame 121 may be a moving member.

In an embodiment, if performing the aforementioned step of displacement correction is necessary, after the completion of the aforementioned step of displacement correction, another second image of the electronic component 721 located on the flexible carrier 710 may be selectively captured by the first image capture device 111 again. Moreover, by comparing the another second image with the first image, whether the displacement correction needs to be performed again is determined.

Figure 1C:
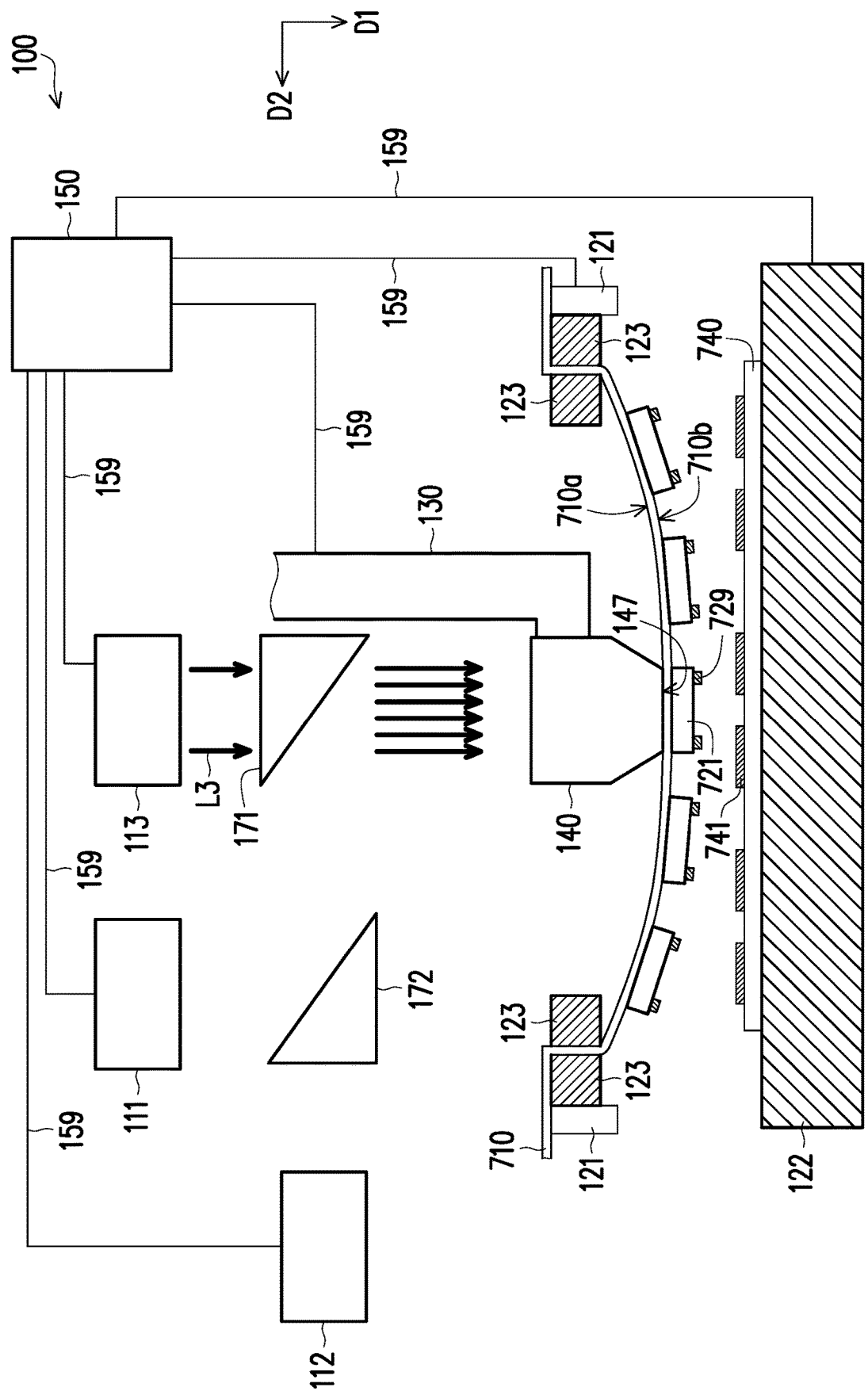

Referring to FIGS. 1B to 1C, the abutting component 140 may further abut against the flexible carrier 710, so that the flexible carrier 710 is deformed correspondingly (i.e., the flexible carrier 710 is bent towards the direction of the target substrate 740). In addition, an electronic component 721 corresponding to the abutting component 140 may be brought close to the target substrate 740 by the manner of the abutting component 140 being close to the target substrate 740. In this way, as shown in FIG. 1D, the electronic component 721 corresponding to the position where the abutting component 140 abuts against the flexible carrier 710 is in contact with the target substrate 740.

In the embodiment, in the direction parallel to the abutting direction D1, the abutting component 140 may be a moving member, and the first frame 121 and the second frame 122 are not moving members, but the disclosure is not limited thereto. In an unillustrated embodiment, in a direction parallel to the abutting direction D1, the first frame 121 and the second frame 122 may be moving members, and the abutting component 140 is not a moving member. In an unillustrated embodiment, in a direction parallel to the abutting direction D1, the abutting component 140, the first frame 121, and the second frame 122 may all be moving members.

Figure 1D:
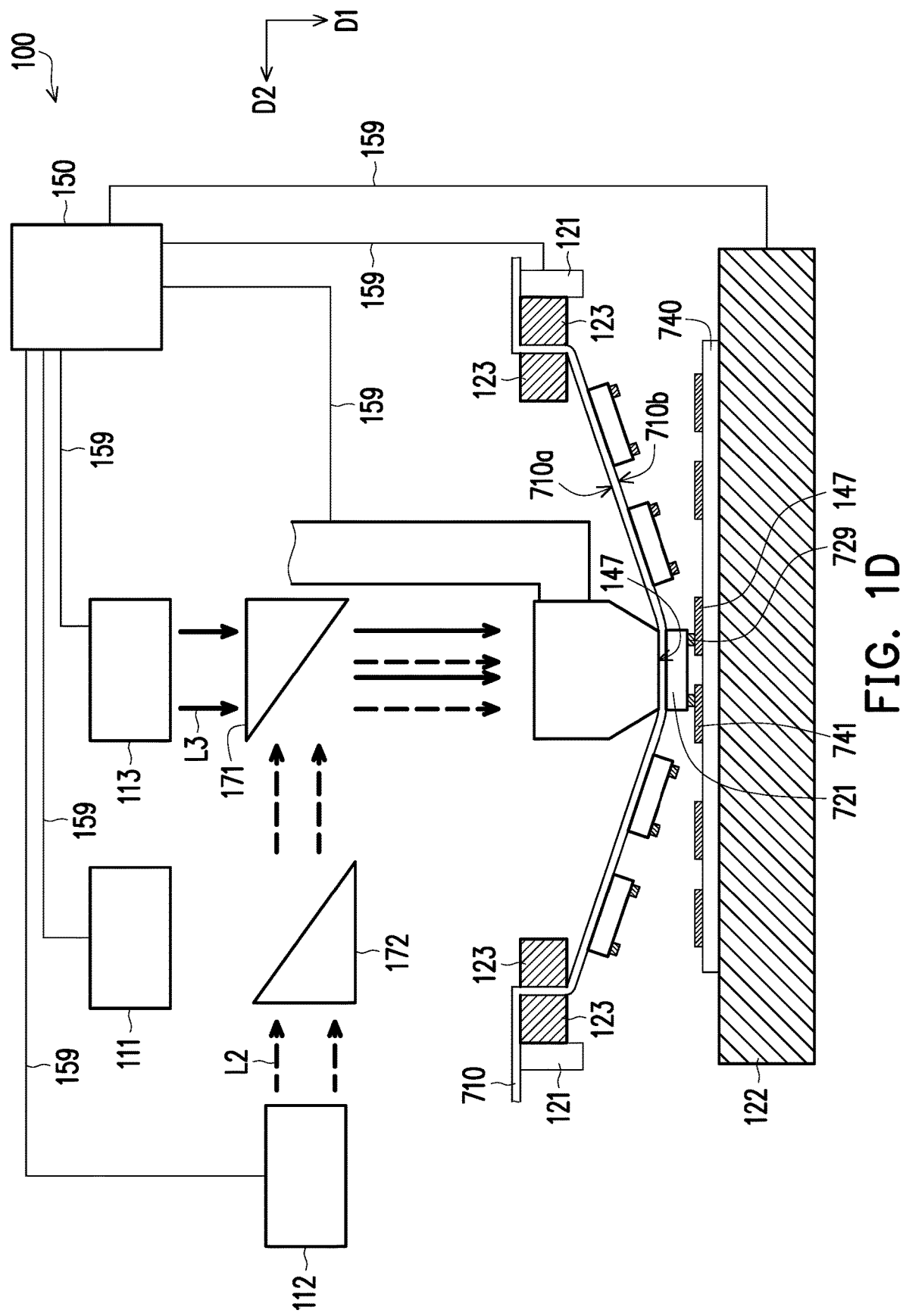

Referring to FIG. 1D, when and/or after the abutting component 140 abuts against the flexible carrier 710 and the electronic component 721 corresponding to the abutting component 140 is in contact with the target substrate 740, a third image of the electronic component 721 may be captured by the second image capture device 112.

In the embodiment, whether the displacement correction is required may be determined by comparing the third image with the aforementioned first image or the aforementioned second image.

Figure 4:
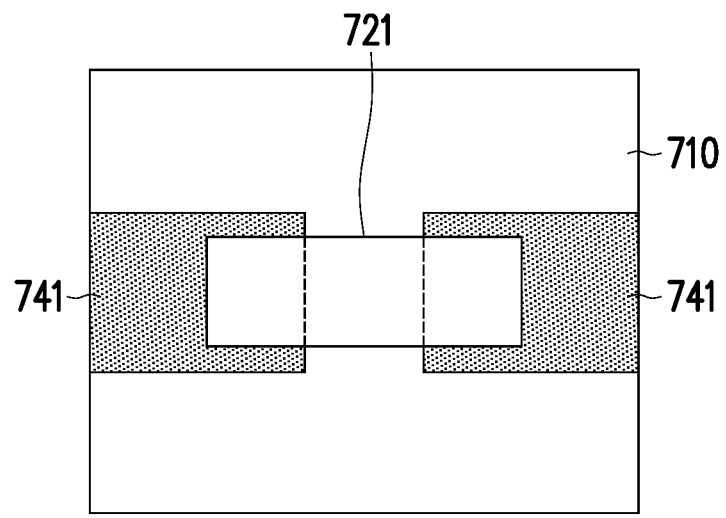

For example, if the third image may be the same as or similar to the image shown in FIG. 4, it may be considered that the corresponding electronic component 721 is not displaced or the displacement is within an acceptable range (e.g., the conductive connecting members located on two opposite ends of the electronic component 721 still overlap the corresponding pads 741).

Therefore, the step of displacement correction may be omitted.

For another example, if the third image may be the same as or similar to the image shown in FIG. 3 and/or different from the image shown in FIG. 4, it may be considered that the displacement of the corresponding electronic component 721 exceeds the standard. Therefore, the step of displacement correction may be performed. Specifically, taking FIG. 3 as an example, the original expected position of the electronic component 721 in the second image may be shown as a dotted line (i.e., the position corresponding to FIG. 4). However, if the actual position of the electronic component 721 in the third image has been shifted, the data processing module 150 may compute the offset vector of the electronic component 721 (i.e., including the direction of shift and the distance of shift), and displacement correction may be performed.

In an embodiment, if performing the aforementioned step of displacement correction is necessary, after the completion of the aforementioned step of displacement correction, another third image of the electronic component 721 may be selectively captured by the second image capture device 112. Moreover, by comparing the another third image with the aforementioned first image or the aforementioned second image, whether the displacement correction needs to be performed again is determined.

Please continue to refer to FIG. 1D. If the electronic component 721 is not displaced or the displacement is within an acceptable range, the energy beam L3 is projected to the electronic component 721 on the flexible carrier 710 by the energy generating device 113. The energy beam L3 may include a heating beam. The heating beam may pass through at least a portion of the abutting component 140 and emit from the abutting end 147 of the abutting component 140, so that the conductive connecting member 729 of the electronic component 721 corresponding to the abutting component 140 is at least partially melted, and the melted at least a portion of the conductive connecting member 729 may be in contact with the corresponding pad 741 on the target substrate 740. And then, the projection of the heating beam may be stopped, and the heat may be dissipated by an appropriate method (e.g., by a fan or other active heat dissipation methods; or by a passive heat dissipation method to set it aside for a period of time), so that the electronic component 721 is soldered and fixed on the target substrate 740 and electrically connected to the corresponding circuit on the target substrate 740.

Figure 1F:
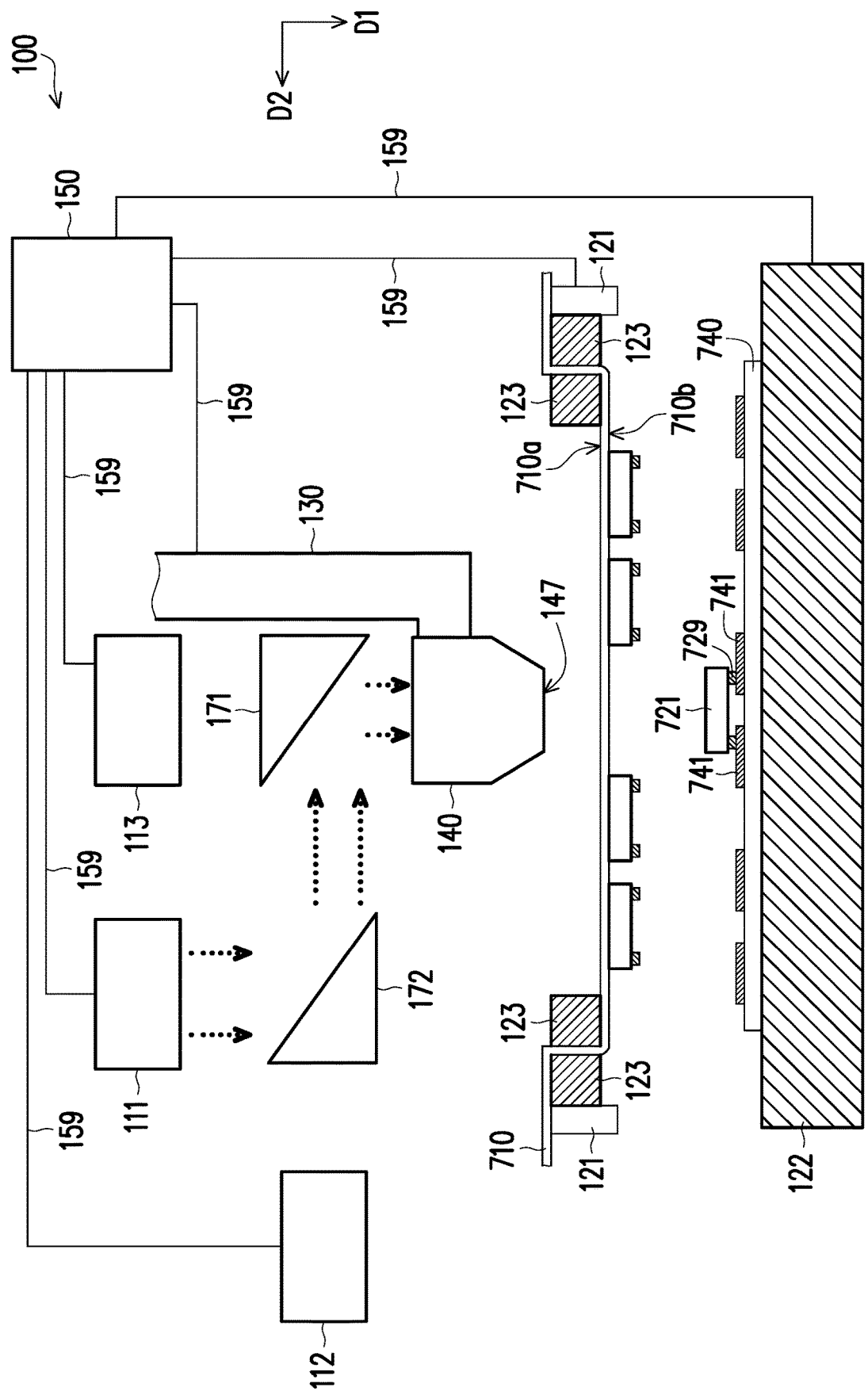

Referring to FIGS. 1D to 1E, the abutting component 140 is kept away from the target substrate 740, so that the flexible carrier 710 with proper elasticity/deflection may be restored to the original shape as shown in FIG. 1F. In addition, after the electronic component 721 is soldered and fixed on the target substrate 740, the bonding force between the electronic component 721 and the target substrate 740 is greater than the bonding force between the electronic component 721 and the flexible carrier 710, so that the electronic component 721 soldered and fixed on the target substrate 740 is separated from the flexible carrier 710. In this way, the transfer action and the soldering action of the electronic component 721 may be completed by the aforementioned single step.

By the above exemplary method, the electronic component 721 may be transferred from the flexible carrier 710 to the target substrate 740 by the electronic component transfer apparatus 100.

In an embodiment, after the flexible carrier 710 is restored to the original shape as shown in FIG. 1F, a fourth image of the flexible carrier 710 may be selectively captured by the first image capture device 111 to determine whether the electronic component 721 is separated from the flexible carrier 710.

Figure 5:
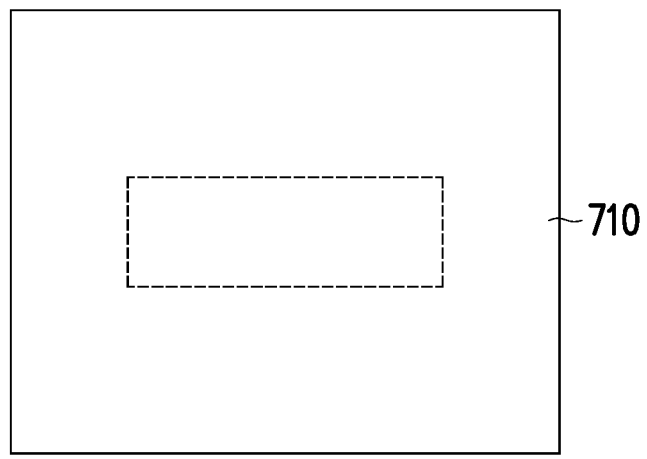

For another example, if the fourth image may be the same as or similar to the image shown in FIG. 5, it may be considered that the electronic component 721 has been separated from the flexible carrier 710. Specifically, taking FIG. 5 as an example, if the electronic component 721 is not separated from the flexible carrier 710, the expected position of the unseparated electronic component 721 in the fourth image may be shown as a dotted line (i.e., the position corresponding to FIG. 2). In other words, taking FIG. 5 as an example, if the fourth image does not have the same or similar pattern or shape as the electronic component 721, it may be determined that the electronic component 721 has been separated from the flexible carrier 710.

Figure 6:
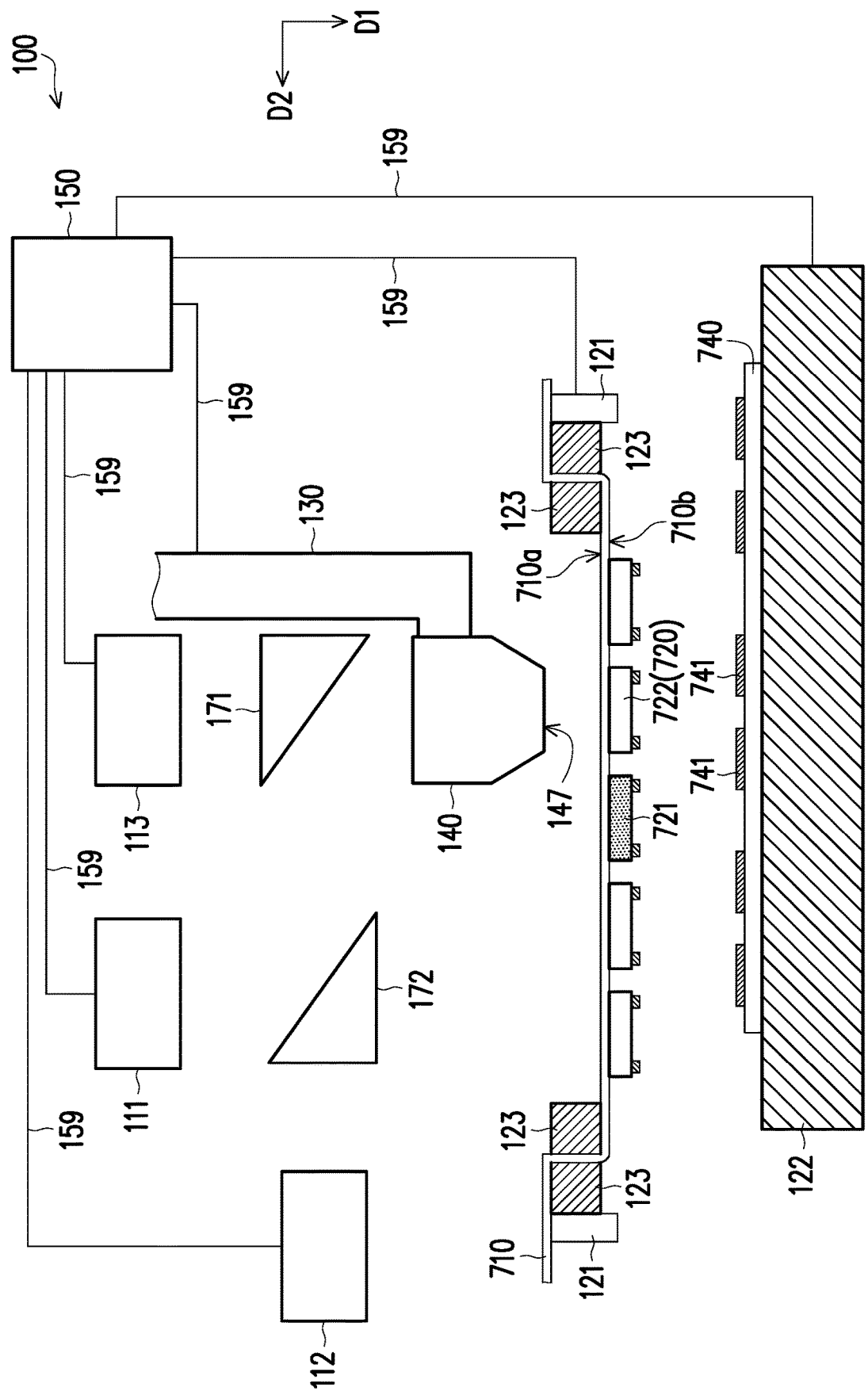
FIG. 6 is a partial side schematic view of a part of an operation mode of an apparatus for transferring electronic component according to an embodiment of the disclosure.

Referring to FIG. 6, In an embodiment, if the electronic component 721 is not well transferred to the target substrate 740, the first frame 121, the second frame 122, the actuating mechanism 130, and/or the energy generating device 113 may be moved in an appropriate direction (e.g., a direction D2 perpendicular to the abutting direction D1), so that another electronic component 722 (another one of the electronic components 720) corresponds to the place to be transferred, and the another electronic component 722 is transferred in the same or similar manner as described above.

In an embodiment, if the electronic component 721 has been well transferred to the target substrate 740, the first frame 121, the second frame 122, the actuating mechanism 130, and/or the energy generating device 113 may be moved in an appropriate direction (e.g., a direction D2 perpendicular to the abutting direction D1) to transfer another electronic component 720 (another one of the electronic components 720 different from the electronic component 721) to the corresponding place in the same or similar manner as described above.

The method for transferring electronic components of the above-mentioned embodiments may be applied to any suitable electronic device. For example, the electronic component 720 may include a light-emitting diode die, and the transfer method described above may be a part of the manufacturing process of a light-emitting diode panel.

In summary, the electronic component transfer apparatus and the electronic component transfer method of the disclosure may be adapted for transferring the electronic components on the flexible carrier to the target substrate.

What is claimed is:

1. An electronic component transfer apparatus, configured to transfer an electronic component on a flexible carrier to a target substrate, the electronic component transfer apparatus comprising:
   a first frame, configured to carry the flexible carrier;
   a second frame, configured to carry the target substrate, and the target substrate disposed opposite to the flexible carrier;
   an abutting component, disposed adjacent to the flexible carrier and having an abutting end;
   an actuating mechanism, configured to actuate the abutting component, and the abutting component moved towards a direction of the flexible carrier, so that the abutting end of the abutting component abuts against the flexible carrier;
   an energy generating device, capable of generating an energy beam, and the energy beam directed towards the flexible carrier through the abutting end of the abutting component;
   an image capture device, capable of generating a light beam through the abutting end of the abutting component, and configured to capture an image through the abutting end of the abutting component; and
   a data processing module, configured to receive and compute the image captured by the image capture device, and determine whether to adjust a relative position between the abutting end and the flexible carrier according to a computation result.

2. The electronic component transfer apparatus according to claim 1, wherein the energy beam is a laser beam.

3. The electronic component transfer apparatus according to claim 1, wherein the abutting component is transparent.

4. The electronic component transfer apparatus according to claim 1, wherein the abutting component has a channel extending to the abutting end.

5. An electronic component transfer method, comprising:
   providing a flexible carrier carrying an electronic component on a surface thereof;
   providing a target substrate disposed with a bonding pad on a surface thereof;
   disposing the surface of the flexible carrier carrying the electronic component opposite to the surface of the target substrate disposed with the bonding pad, and disposing a solder on at least one of the electronic component and the bonding pad;
   providing an abutting component, allowing light to pass through, having an abutting end, and located at an original position;
   moving the abutting component away from the original position towards a surface of the flexible carrier not carrying the electronic component, and abutting against the surface with the abutting end, so that the flexible carrier is deformed, and the electronic component is moved towards the target substrate;
   capturing an image of a position of the electronic component through the abutting end of the abutting component by generating a light beam through the abutting end of the abutting component;
   computing an offset vector of the position of the electronic component;
   changing as necessary a relative position between the abutting end of the abutting component and the flexible carrier according to the offset vector, so as to correct the offset vector;
   providing an energy beam, directing the energy beam to pass through the abutting component to melt the solder between the electronic component and the bonding pad, and soldering and fixing the electronic component on the target substrate by the solder; and
   returning the abutting component to the original position.

6. The electronic component transfer method according to claim 5, wherein the offset vector is corrected as necessary before the electronic component is soldered and fixed on the target substrate.

7. The electronic component transfer method according to claim 5, wherein the offset vector is corrected as necessary after the abutting component is returned to the original position.

8. The electronic component transfer method according to claim 5, wherein the abutting component is moved to change the relative position between the abutting end and the flexible carrier, so as to correct the offset vector.

9. The electronic component transfer method according to claim 5, wherein the abutting component is transparent.

10. The electronic component transfer method according to claim 5, wherein the abutting component has a channel extending to the abutting end.

11. A method of manufacturing a light-emitting diode panel, comprising transferring a light-emitting diode die to a target substrate by the electronic component transfer method as recited in claim 5, wherein the electronic component includes a light-emitting diode die.

* * * * *